United States Patent
Kori et al.

(10) Patent No.: US 7,033,922 B2
(45) Date of Patent: *Apr. 25, 2006

(54) METHOD AND SYSTEM FOR CONTROLLING THE PRESENCE OF FLUORINE IN REFRACTORY METAL LAYERS

(75) Inventors: Moris Kori, Palo Alto, CA (US); Alfred W. Mak, Union City, CA (US); Jeong Soo Byun, Cupertino, CA (US); Lawrence Chung-Lai Lei, Milpitas, CA (US); Hua Chung, San Jose, CA (US); Ashok Sinha, Palo Alto, CA (US); Ming Xi, Milpitas, CA (US)

(73) Assignee: Applied Materials. Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/951,354

(22) Filed: Sep. 29, 2004

(65) Prior Publication Data

US 2005/0059241 A1    Mar. 17, 2005

Related U.S. Application Data

(60) Continuation of application No. 09/625,336, filed on Jul. 25, 2000, now Pat. No. 6,855,368, which is a division of application No. 09/605,593, filed on Jun. 28, 2000, now Pat. No. 6,551,929.

(51) Int. Cl.
*H01L 21/44* (2006.01)

(52) U.S. Cl. .......................... 438/607; 438/648; 438/656
(58) Field of Classification Search ................ 438/607, 438/648, 656, 679, 680, 685
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |

(Continued)

FOREIGN PATENT DOCUMENTS

DE    198 20 147 A1    7/1999

(Continued)

OTHER PUBLICATIONS

Yang, et al., "Atomic Layer Deposition of Tungsten Film From WF6/B2H6 Nucleation Layer for Advanced Semiconductor Devices," Conference Proceedings ULSI XVII (2002) Materials Research Society pp. 655-660.

(Continued)

*Primary Examiner*—George Fourson
*Assistant Examiner*—Fernando L. Toledo
(74) *Attorney, Agent, or Firm*—Patterson & Sheridan LLP

(57) ABSTRACT

A method and system to reduce the resistance of refractory metal layers by controlling the presence of fluorine contained therein. The present invention is based upon the discovery that when employing ALD techniques to form refractory metal layers on a substrate, the carrier gas employed impacts the presence of fluorine in the resulting layer. As a result, the method features chemisorbing, onto the substrate, alternating monolayers of a first compound and a second compound, with the second compound having fluorine atoms associated therewith, with each of the first and second compounds being introduced into the processing chamber along with a carrier gas to control a quantity of the fluorine atoms associated with the monolayer of the second compound.

26 Claims, 10 Drawing Sheets

U.S. PATENT DOCUMENTS

| | | |
|---|---|---|
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen et al. |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai et al. |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,807,792 A | 9/1998 | Llg et al. |
| 5,830,270 A | 11/1998 | McKee et al. |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 6,001,669 A | 12/1999 | Gaines et al. |
| 6,015,590 A | 1/2000 | Suntola et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu |
| 6,086,677 A | 7/2000 | Umotoy et al. |
| 6,110,556 A | 8/2000 | Bang et al. |
| 6,113,977 A | 9/2000 | Soininen et al. |
| 6,117,244 A | 9/2000 | Bang et al. |
| 6,124,158 A | 9/2000 | Dautartas et al. |
| 6,130,147 A | 10/2000 | Major et al. |
| 6,139,700 A | 10/2000 | Kang et al. |
| 6,140,237 A | 10/2000 | Chan et al. |
| 6,140,238 A | 10/2000 | Kitch |
| 6,143,659 A | 11/2000 | Leem |
| 6,144,060 A | 11/2000 | Park et al. |
| 6,158,446 A | 12/2000 | Mohindra et al. |
| 6,174,377 B1 | 1/2001 | Doering et al. |
| 6,174,809 B1 | 1/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,302 B1 | 3/2001 | Sugiura et al. |

| | | | | | | |
|---|---|---|---|---|---|---|
| 6,207,487 | B1 | 3/2001 | Kim et al. | 2003/0049942 A1 | 3/2003 | Haukka et al. |
| 6,248,605 | B1 | 6/2001 | Harkonen et al. | 2003/0072975 A1 | 4/2003 | Shero et al. |
| 6,270,572 | B1 | 8/2001 | Kim et al. | | | |
| 6,271,148 | B1 | 8/2001 | Kao et al. | | FOREIGN PATENT DOCUMENTS | |
| 6,284,646 | B1 | 9/2001 | Leem | DE | 196 27 017 A1 | 1/2000 |
| 6,287,965 | B1 | 9/2001 | Kang et al. | EP | 0 344 352 A1 | 12/1989 |
| 6,291,876 | B1 | 9/2001 | Stumborg et al. | EP | 0 429 270 A2 | 5/1991 |
| 6,305,314 | B1 | 10/2001 | Sneh et al. | EP | 0 442 490 A1 | 8/1991 |
| 6,306,216 | B1 | 10/2001 | Kim et al. | EP | 0 799 641 A2 | 10/1997 |
| 6,316,098 | B1 | 11/2001 | Yitzchaik et al. | EP | 1 167 569 A1 | 1/2002 |
| 6,333,260 | B1 | 12/2001 | Kwon et al. | FR | 2 626 110 A1 | 7/1989 |
| 6,342,277 | B1 | 1/2002 | Sherman | FR | 2 692 597 A1 | 12/1993 |
| 6,355,561 | B1 | 3/2002 | Sandhu et al. | GB | 2 355 727 A | 5/2001 |
| 6,358,829 | B1 | 3/2002 | Yoon et al. | JP | 2000-340883 | 12/0000 |
| 6,368,954 | B1 | 4/2002 | Lopatin et al. | JP | 58-098917 | 6/1983 |
| 6,369,430 | B1 | 4/2002 | Adetutu et al. | JP | 58-100419 | 6/1983 |
| 6,372,598 | B1 | 4/2002 | Kang et al. | JP | 60-065712 | 4/1985 |
| 6,399,491 | B1 | 6/2002 | Jeon et al. | JP | 61-035847 | 2/1986 |
| 6,420,189 | B1 | 7/2002 | Lopatin | JP | 61-210623 | 9/1986 |
| 6,423,619 | B1 | 7/2002 | Grant et al. | JP | 61-069508 | 3/1987 |
| 6,447,933 | B1 | 9/2002 | Wang et al. | JP | 62-091495 | 4/1987 |
| 6,451,695 | B1 | 9/2002 | Sneh et al. | JP | 62-141717 | 6/1987 |
| 6,468,924 | B1 | 10/2002 | Lee et al. | JP | 62-167297 | 7/1987 |
| 6,475,276 | B1 | 11/2002 | Elers et al. | JP | 62-171999 | 7/1987 |
| 6,475,910 | B1 | 11/2002 | Sneh | JP | 62-232919 | 10/1987 |
| 6,482,262 | B1 | 11/2002 | Elers et al. | JP | 63-085098 | 4/1988 |
| 6,482,733 | B1 | 11/2002 | Raaijmakers et al. | JP | 63-090833 | 4/1988 |
| 6,482,740 | B1 | 11/2002 | Soininen et al. | JP | 63-222420 | 9/1988 |
| 6,534,395 | B1 | 3/2003 | Werkhoven et al. | JP | 63-222421 | 9/1988 |
| 6,551,929 | B1 | 4/2003 | Kori et al. | JP | 63-227007 | 9/1988 |
| 6,635,965 | B1 | 10/2003 | Lee et al. | JP | 63-252420 | 10/1988 |
| 6,855,368 | B1 * | 2/2005 | Kori et al. ............... 118/715 | JP | 63-266814 | 11/1988 |
| 2001/0000866 | A1 | 5/2001 | Sneh et al. | JP | 64-009895 | 1/1989 |
| 2001/0002280 | A1 | 5/2001 | Sneh | JP | 64-009896 | 1/1989 |
| 2001/0009140 | A1 | 7/2001 | Bondestam et al. | JP | 64-009897 | 1/1989 |
| 2001/0009695 | A1 | 7/2001 | Saanila et al. | JP | 64-037832 | 2/1989 |
| 2001/0011526 | A1 | 8/2001 | Doering et al. | JP | 64-082615 | 3/1989 |
| 2001/0024387 | A1 | 9/2001 | Raaijmakers et al. | JP | 64-082617 | 3/1989 |
| 2001/0028924 | A1 | 10/2001 | Sherman | JP | 64-082671 | 3/1989 |
| 2001/0029094 | A1 | 10/2001 | Mee-Young et al. | JP | 64-082676 | 3/1989 |
| 2001/0031562 | A1 | 10/2001 | Raaijmakers et al. | JP | 01-103982 | 4/1989 |
| 2001/0034123 | A1 | 10/2001 | Jeon et al. | JP | 01-103996 | 4/1989 |
| 2001/0041250 | A1 | 11/2001 | Werkhoven et al. | JP | 64-090524 | 4/1989 |
| 2001/0042799 | A1 | 11/2001 | Kim et al. | JP | 01-117017 | 5/1989 |
| 2001/0054730 | A1 | 12/2001 | Kim et al. | JP | 01-143221 | 6/1989 |
| 2001/0054769 | A1 | 12/2001 | Raaijmakers et al. | JP | 01-143233 | 6/1989 |
| 2002/0000598 | A1 | 1/2002 | Kang et al. | JP | 01-154511 | 6/1989 |
| 2002/0004293 | A1 | 1/2002 | Soininen et al. | JP | 01-236657 | 9/1989 |
| 2002/0007790 | A1 | 1/2002 | Park | JP | 01-245512 | 9/1989 |
| 2002/0019121 | A1 | 2/2002 | Pyo | JP | 01-264218 | 10/1989 |
| 2002/0031618 | A1 | 3/2002 | Sherman | JP | 01-270593 | 10/1989 |
| 2002/0037630 | A1 | 3/2002 | Agarwal et al. | JP | 01-272108 | 10/1989 |
| 2002/0048880 | A1 | 4/2002 | Lee | JP | 01-290221 | 11/1989 |
| 2002/0052097 | A1 | 5/2002 | Park | JP | 01-290222 | 11/1989 |
| 2002/0055235 | A1 | 5/2002 | Agarwal et al. | JP | 01-296673 | 11/1989 |
| 2002/0061612 | A1 | 5/2002 | Sandhu et al. | JP | 01-303770 | 12/1989 |
| 2002/0076507 | A1 | 6/2002 | Chiang et al. | JP | 01-305894 | 12/1989 |
| 2002/0076837 | A1 | 6/2002 | Hujanen et al. | JP | 01-313927 | 12/1989 |
| 2002/0090829 | A1 | 7/2002 | Sandhu et al. | JP | 02-012814 | 1/1990 |
| 2002/0094689 | A1 | 7/2002 | Park | JP | 02-014513 | 1/1990 |
| 2002/0105088 | A1 | 8/2002 | Yang et al. | JP | 02-017634 | 1/1990 |
| 2002/0106846 | A1 | 8/2002 | Seutter et al. | JP | 02-063115 | 3/1990 |
| 2002/0109168 | A1 | 8/2002 | Kim et al. | JP | 02-074029 | 3/1990 |
| 2002/0117399 | A1 | 8/2002 | Chen et al. | JP | 02-074587 | 3/1990 |
| 2002/0121697 | A1 | 9/2002 | Marsh | JP | 02-106822 | 4/1990 |
| 2002/0155722 | A1 | 10/2002 | Satta et al. | JP | 02-129913 | 5/1990 |
| 2002/0162506 | A1 | 11/2002 | Sneh et al. | JP | 02-162717 | 6/1990 |
| 2002/0182320 | A1 | 12/2002 | Leskela et al. | JP | 02-172895 | 7/1990 |
| 2002/0187256 | A1 | 12/2002 | Elers et al. | JP | 02-196092 | 8/1990 |
| 2002/0187631 | A1 | 12/2002 | Kim et al. | JP | 02-203517 | 8/1990 |
| 2003/0013320 | A1 | 1/2003 | Kim et al. | JP | 02-230690 | 9/1990 |
| 2003/0032281 | A1 | 2/2003 | Werkhoven et al. | JP | 02-230722 | 9/1990 |

| | | |
|---|---|---|
| JP | 02-246161 | 10/1990 |
| JP | 02-264491 | 10/1990 |
| JP | 02-283084 | 11/1990 |
| JP | 02-304916 | 12/1990 |
| JP | 03-019211 | 1/1991 |
| JP | 03-022569 | 1/1991 |
| JP | 03-023294 | 1/1991 |
| JP | 03-023299 | 1/1991 |
| JP | 03-044967 | 2/1991 |
| JP | 3-48421 | 3/1991 |
| JP | 03-048421 | 3/1991 |
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 03-286531 | 12/1991 |
| JP | 3-286531 | 12/1991 |
| JP | 04-031391 | 2/1992 |
| JP | 04-031396 | 2/1992 |
| JP | 04-100292 | 4/1992 |
| JP | 04-111418 | 4/1992 |
| JP | 04-132214 | 5/1992 |
| JP | 04-132681 | 5/1992 |
| JP | 04/151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04-260696 | 9/1992 |
| JP | 04-273120 | 9/1992 |
| JP | 04-285167 | 10/1992 |
| JP | 04-291916 | 10/1992 |
| JP | 04-325500 | 11/1992 |
| JP | 04-328874 | 11/1992 |
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 6-291048 | 10/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 8-264530 | 10/1996 |
| JP | 08-264530 | 10/1996 |
| JP | 09-260786 | 10/1997 |
| JP | 09-293681 | 11/1997 |
| JP | 63-062313 | 3/1998 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-138094 | 5/2000 |
| JP | 2000-218445 | 8/2000 |
| JP | 2000-319772 | 11/2000 |
| JP | 2000-353666 | 12/2000 |
| JP | 2001-020075 | 1/2001 |
| JP | 2001-62244 | 3/2001 |
| JP | 2001-111000 | 4/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | WO 90/02216 A1 | 3/1990 |
| WO | WO 91/10510 A1 | 7/1991 |
| WO | WO 93/02111 A1 | 2/1993 |
| WO | WO 96/17107 A1 | 6/1996 |
| WO | WO 96/018756 A1 | 6/1996 |
| WO | WO 98/06889 A2 | 2/1998 |
| WO | WO 98/51638 A1 | 11/1998 |
| WO | WO 99/01595 A1 | 1/1999 |
| WO | WO 99/13504 A1 | 3/1999 |
| WO | WO 99/29924 A1 | 6/1999 |
| WO | WO 99/41423 A2 | 8/1999 |
| WO | WO 00/11721 A1 | 3/2000 |
| WO | WO 00/15665 A1 | 3/2000 |
| WO | WO 00/15881 A2 | 3/2000 |
| WO | WO 00/16377 A2 | 3/2000 |
| WO | WO 00/54320 A1 | 9/2000 |
| WO | WO 00/63957 A1 | 10/2000 |
| WO | WO 00/79019 A1 | 12/2000 |
| WO | WO 00/79576 A1 | 12/2000 |
| WO | WO 01/15220 A1 | 3/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/36702 A1 | 5/2001 |
| WO | WO 01/40541 A1 | 6/2001 |
| WO | WO 01/66832 A2 | 9/2001 |
| WO | WO 02/045167 A2 | 6/2002 |
| WO | WO 02/067319 A2 | 8/2002 |

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

Scheper, et al., "Low-temperature Deposition of Titanium Nitride Films From Dialkylhydrazine-based Precursors", Materials Science in Semiconductor Processing 2 (1999), pp. 149-157.

Suzuki, et al., "A 0.2-μm Contact Filing by 450° C.-hydrazine-reduced TiN film With Low Resistivity", IEDM 92-979, pp. 11.8.1-11.8.3.

Suzuki, et al., "LPCVD-TiN Using Hydrazine and TiCl$_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools"(May 1992), pp. 190-191.

McGeachin, S., "Synthesis and Properties of Some β-diketimines Derived From Acetylacetone, and Their Metal Complexes", Canadian J. of Chemistry, vol. 46 (1968), pp. 1903-1912.

Solanki, et al., "Atomic Layer Deposition of Copper Seed Layers", Electrochemical and Solid State Letters, 3(10) (2000), pp. 479-480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

Rossnagel, et al., NERAC Search abstract of "Atomic Layer Deposition of Ta and Ti for Interconnect Diffusion Barriers", J. Vac. Sci. & Tech., 18(4) (Jul. 2000).

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149-154.

Choi, et al., "The Effect of Annealing on Resistivity of Low Pressure Chemical Vapor Depositied Titanium Diboride", J. Appl. Phys. 69(11) (Jun. 1, 1991), pp. 7853-7861.

Choi, et al., "Stability of TiB$_2$ as a Diffusion Barrier on Silicon", J. Electrochem. Soc. 138(10) (Oct. 1991), pp. 3062-3067.

Dan Maydan, "Cluster Tools for Fabrication of Advanced devices" Jap. J. of Applied Physics, Extended Abstracts, 22$^{nd}$ Conference Solid State Devices and Materials (1990), pp. 849-852.

Katherine Derbyshire,"Applications of Integrated Processing", Solid State Technology, US, Cowan Pub., vol. 37, No. 12 (Dec. 1, 1994), pp. 45-47.

Kitigawa, et al., "Hydrogen-mediated Low Temperature Epitaxy of Si in Plasma-enhanced Chemical Vapor Deposition", Applied Surface Science (2000), pp. 30-34.

Lee, et al., "Pulsed nucleation for Ultra-high Aspect Ratio Tungsten Plugfill", Novellus Systems, Inc. (2001), pp. 1-2.

Hultman, et al., "Review of the Thermal and Mechanical Stability of TiN-based Thin Films", Zeitschrift Fur Metallkunde, 90(10) (Oct. 1999), pp. 803-813.

Klaus, et al., "Atomic Layer Deposition of SiO$_2$ Using Catalyzed and Uncatalyzed Self-Limiting Surface Reactions", Surface Review & Letters, 6(3&4) (1999), pp. 435-448.

Yamaguchi, et al., "Atomic-layer Chemical-Vapor-Deposition of Silicon Dioxide Films With Extremely Low Hydrogen Content", Appl. Surf. Sci., vol. 130-132 (1998), pp. 202-207.

George, et al., "Surface Chemistry for Atomic Layer Growth", J. Phys. Chem., vol. 100 (1996), pp. 13121-13131.

George, et al., "Atomic Layer Controlled Deposition of SiO$_2$ and Al$_2$O$_3$ Using ABAB . . . Binary Reaction Sequence Chemistry", Appl. Surf. Sci., vol. 82/83 (1994), pp. 460-467.

Wise, et al., "Diethyldiethoxysilane as a New Precursor for SiO$_2$ Growth on Silicon", Mat. Res. Soc. Symp. Proc., vol. 334 (1994), pp. 37-43.

Niinisto, et al., "Synthesis of Oxide Thin Films and Overlayers by Atomic Layer Epitaxy for Advanced Applications", Mat. Sci. & Eng., vol. B41 (1996), pp. 23-29.

Ritala, et al., "Perfectly Conformal TiN and Al$_2$O$_3$ Films Deposited by Atomic Layer Deposition", Chemical Vapor Deposition, vol. 5(1) (Jan. 1999), pp. 7-9.

Klaus, et al., "Atomically Controlled Growth of Tungsten and Tungsten Nitride Using Sequential Surface Reactions". Appl. Surf. Sci., vol. 162-163 (2000), pp. 479-491.

Min, et al., "Atomic Layer Deposition of TiN Thin Films by Sequential Introduction of Ti Precursor and NH/sub3/", Symp.: Advanced Interconnects and Contact Materials and Processes for Future Integrated Circuits (Apr. 13-16, 1998), pp. 337-342.

Klaus, et al., "Atomic Layer Deposition of Tungsten using Sequential Surface Chemistry with a Sacrificial Stripping Reaction," Thin Solid Films 360 (2000), pp. 145-153, (Accepted Nov. 16, 1999).

Min, et al., "Metal-Organic Atomic-Layer Deposition of Titanium-Silicon-Nitride Films", Applied Physics Letters, American Inst. Of Physics, vol. 75(11) (Sep. 13, 1999).

Martensson, et al., "Atomic Layer Epitaxy of Copper on Tantalum", Chemical Vapor Deposition, 3(1) (Feb. 1, 1997), pp. 45-50.

Ritala, et al. "Atomic Layer Epitaxy Growth of TiN Thin Films", J. Electrochem. Soc., 142(8) (Aug. 1995), pp. 2731-2737.

Elers, et al., "NbCl$_5$ As a Precursor in Atomic Layer Epitaxy", Appl. Surf. Sci., vol. 82/83 (1994), pp. 468-474.

Lee, "The Preparation of Titanium-Based Thin Film by CVD Using Titanium Chlorides as Precursors", Chemical Vapor Deposition, 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/H2 Process", J. Electrochem. Soc. , 145(8) (Aug. 1998), pp. 2926-2931.

Min, et al., "Chemical Vapor Deposition of Ti-Si-N Films with Alternating Source Supply", Mat., Res. Soc. Symp. Proc., vol. 564 (Apr. 5, 1999), pp. 207-210.

Bedair, "Atomic Layer Epitaxy Deposition Processes", J. Vac. Sci. Techol. 12(1) (Jan./Feb. 1994).

Yamaga, et al., "Atomic Layer Epitaxy of ZnS by a New Gas Supplying System in a Low-pressure Metalorganic Vapor Phase Epitaxy", J. of Crystal Growth 117 (1992), pp. 152-155.

Elam, et al., "Nucleation and Growth During Tungsten Atomic Layer Deposition on SiO2 Surfaces," Thin Solid Films 386 (2001) pp. 41-52.

* cited by examiner

METHOD AND SYSTEM FOR CONTROLLING THE PRESENCE OF FLUORINE IN REFRACTORY METAL LAYERS

CROSS-REFERENCE TO RELATED APPLICATIONS

This application is a continuation of U.S. patent application Ser. No. 09/625,336, filed Jul. 25, 2000, now issued as U.S. Pat. No. 6,855,368, which is a divisional patent application of U.S. patent application Ser. No. 09/605,593, filed Jun. 28, 2000, now issued as U.S. Pat. No. 6,551,929.

BACKGROUND OF THE INVENTION

1. Field of the Invention

This invention relates to the processing of semiconductor substrates. More particularly, this invention relates to improvements in the process of depositing refractory metal layers on semiconductor substrates

2. Description of the Related Art

The semiconductor processing industry continues to strive for larger production yields while increasing the uniformity of layers deposited on substrates having increasing larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, is Atomic Layer Deposition (ALD). ALD is based upon Atomic Layer Epitaxy (ALE) that was originally employed to fabricate electroluminescent displays. ALD employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previous deposited layers to form a uniform layer on the substrate. The cycle is repeated to form the layer to a desired thickness. A drawback with ALD techniques is that the deposition rate is much lower than typical CVD techniques by at least one order of magnitude.

Employing the aforementioned deposition techniques it is seen that formation of a layer at a high deposition rate while providing adequate step coverage are conflicting characteristics often necessitating sacrificing one to obtain the other. This has been prevalent when depositing refractory metal layers to cover gaps or vias during formation of contacts that interconnect adjacent metallic layers separated by a dielectric layer. Historically, CVD techniques have been employed to deposit conductive material in order to inexpensively and quickly form contacts. Due to the increasing integration of semiconductor circuitry, tungsten has been used based upon the superior step coverage of tungsten. As a result, deposition of tungsten employing CVD techniques enjoys wide application in semiconductor processing due to the high throughput of the process.

Depositing tungsten in this manner, however, is attendant with several disadvantages. For example, blanket deposition of a tungsten layer on a semiconductor wafer is time-consuming at temperatures below 400° C. The deposition rate of tungsten may be improved by increasing the deposition temperature to, e.g., about 500° C. to about 550° C. Temperatures in this range may compromise the structural and operational integrity of the underlying portions of the integrated circuit being formed. Tungsten has also frustrated photolithography steps during the manufacturing process by providing a relatively rough surface having a reflectivity of 20% or less than that of a silicon substrate. Finally, tungsten has proven difficult to deposit uniformly. This has been shown by variance in tungsten layers' thickness of greater than 1%, which frustrates control of the resistivity of the layer. Several prior attempts to overcome the aforementioned drawbacks have been attempted.

For example, in U.S. Pat. No. 5,028,565 to Chang et al., which is assigned to the assignee of the present invention, a method is disclosed to improve, inter alia, uniformity of tungsten layers by varying the deposition chemistry. The method includes, in pertinent part, formation of a nucleation layer over an intermediate barrier layer before depositing the tungsten layer via bulk deposition. The nucleation layer is formed from a gaseous mixture of tungsten hexafluoride, hydrogen, silane and argon. The nucleation layer is described as providing a layer of growth sites to promote uniform deposition of a tungsten layer. The benefits provided by the nucleation layer are described as being dependent upon the barrier layer present. For example, were the barrier layer formed from titanium nitride the tungsten layer's thickness uniformity is improved as much as 15%. Were the barrier layer formed from sputtered tungsten or sputtered titanium tungsten the benefits provided by the nucleation layer are not substantial.

A need exists, therefore, to provide techniques to improve the characteristics of refractory metal layers deposited on semiconductor substrates.

SUMMARY OF THE INVENTION

A method and system reduces the resistance of contacts of refractory metal layers by controlling the presence of fluorine contained therein. The present invention is based upon the discovery that when employing ALD techniques to form refractory metal layers on a substrate, the carrier gas employed impacts the presence of fluorine in the resulting layer. As a result, the method features chemisorbing onto the substrate alternating monolayers of a first compound and a second compound, with the second compound having fluorine atoms associated therewith, with each of the first and second compounds being introduced into the processing chamber along with a carrier gas; and controlling a quantity of the fluorine atoms associated with the monolayer of the second compound as a function of the carrier gas. Specifically, it was found that by introducing the first and second compounds employing $H_2$ as a carrier gas, the amount of fluorine present in the resulting refractory metal layer was substantially reduced, compared to employing either nitrogen, $N_2$, or argon, Ar, as a carrier gas.

To that end, the system includes a processing chamber, having a holder, disposed therein to support the substrate. A gas delivery system and a pressure control system are in fluid communication with the processing chamber. A temperature control system is in thermal communication therewith. A controller is in electrical communication with gas delivery system, temperature control system, and the pressure control system. A memory is in data communication with the controller. The memory comprises a computer-readable medium having a computer-readable program embodied therein. The computer-readable program includes instructions for controlling the operation of the processing chamber.

DETAILED DESCRIPTION OF THE INVENTION

Figure 1:
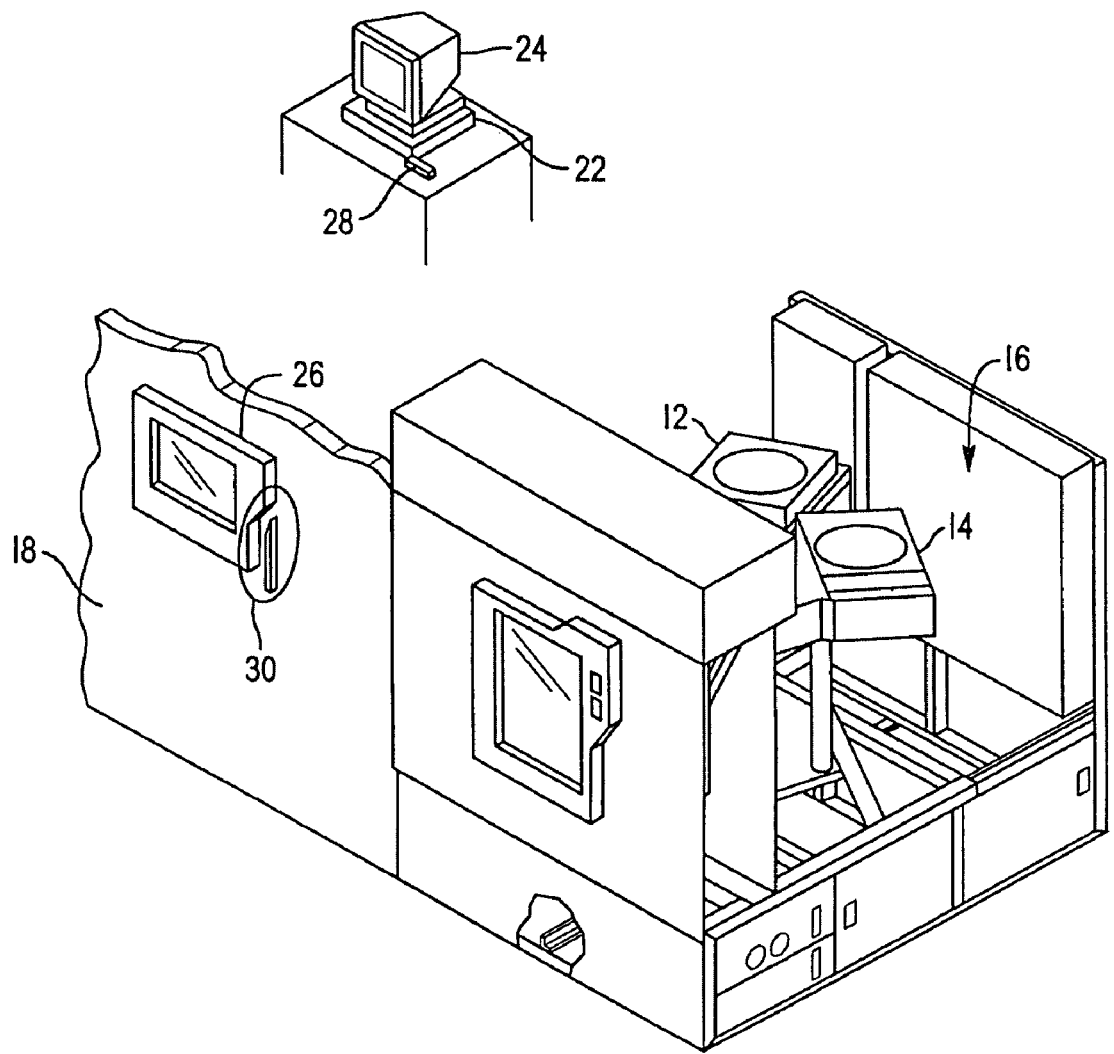
FIG. 1 is a perspective view of a semiconductor processing system in accordance with the present invention.

Referring to FIG. 1, an exemplary wafer processing system includes two or more processing chambers 12 and 14 disposed in a common work area 16 surrounded by a wall 18. The processing chambers 12 and 14 are in data communication with a controller 22 that is connected to one or more monitors, shown as 24 and 26. The monitors typically display common information concerning the process associated with the processing chambers 12 and 14. One of the monitors 26 is mounted to the wall 18, with the remaining monitor 24 being disposed in the work area 16. Operational control of the processing chambers 12 and 14 may be achieved use of a light pen, associated with one of the monitors 24 and 26, to communicate with the controller 22. For example, light pen 28 is associated with monitor 24 and facilitates communication with the controller 22 through monitor 24. Light pen 30 facilitates communication with the controller 22 through monitor 26.

Figure 2:
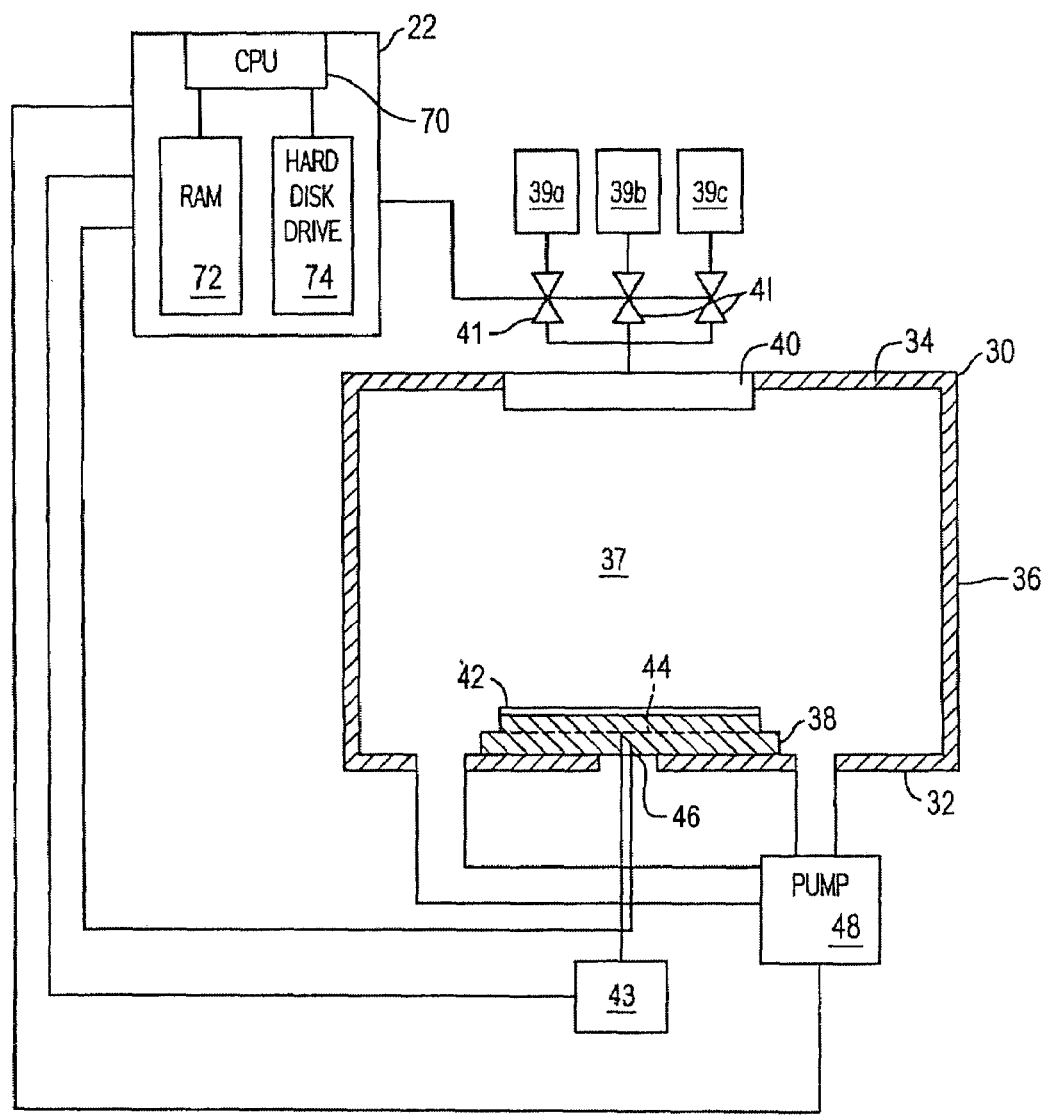
FIG. 2 is a detailed view of the processing chambers shown above in FIG. 1.

Referring both to FIGS. 1 and 2, each of the processing chambers 12 and 14 includes a housing 30 having a base wall 32, a cover 34, disposed opposite to the base wall 32, and a sidewall 36, extending therebetween. The housing 30 defines a chamber 37, and a pedestal 38 is disposed within the processing chamber 37 to support a substrate 42, such as a semiconductor wafer. The pedestal 38 may be mounted to move between the cover 34 and the base wall 32, using a displacement mechanism (not shown). Supplies of processing gases 39a, 39b and 39c are in fluid communication with the processing chamber 37 via a showerhead 40. Regulation of the flow of gases from the supplies 39a, 39b and 39c is effectuated via flow valves 41.

Depending on the specific process, the substrate 42 may be heated to a desired temperature prior to layer deposition via a heater embedded within the pedestal 38. For example, the pedestal 38 may be resistively heated by applying an electric current from an AC power supply 43 to the heater element 44. The wafer 40 is, in turn, heated by the pedestal 38, and can be maintained within a desired process temperature range of, for example, about 20° C. to about 750° C. A temperature sensor 46, such as a thermocouple, is also embedded in the wafer support pedestal 38 to monitor the temperature of the pedestal 38 in a conventional manner. For example, the measured temperature may used in a feedback loop to control the electrical current applied to the heater element 44 by the power supply 43, such that the wafer temperature can be maintained or controlled at a desired temperature which is suitable for the particular process application. The pedestal 38 is optionally heated using radiant heat (not shown). A vacuum pump 48 is used to evacuate the processing chamber 37 and to help maintain the proper gas flows and pressure inside the processing chamber 37.

Figure 3:
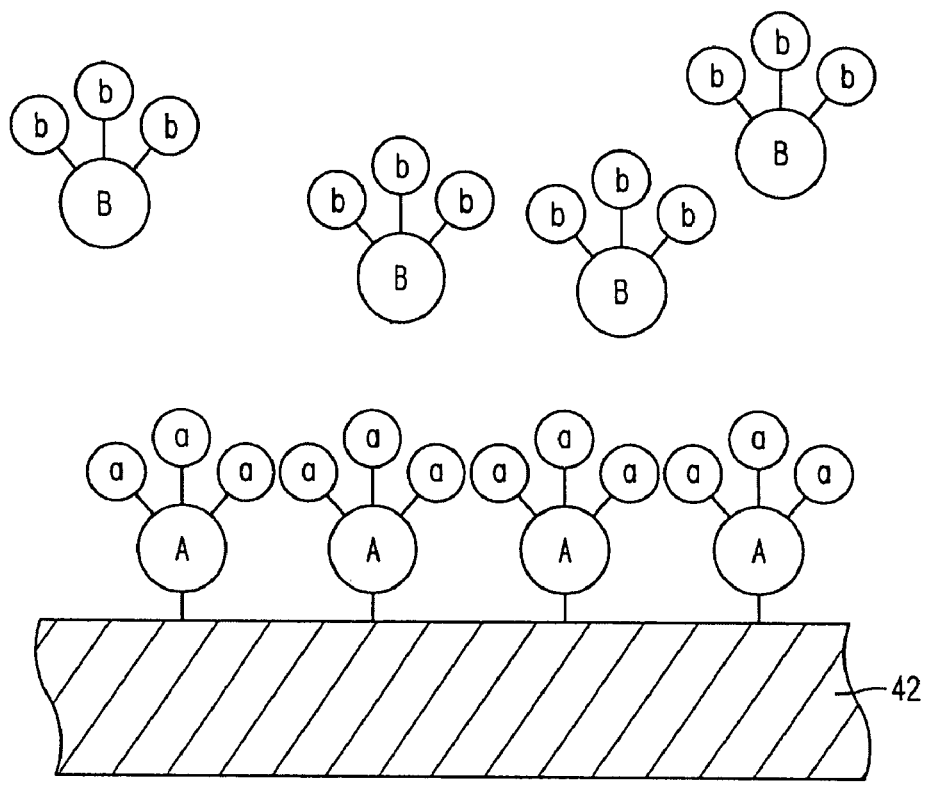
FIG. 3 is a schematic view showing deposition of a first molecule onto a substrate during ALD.

Referring to FIGS. 1 and 3, one or both of the processing chambers 12 and 14, discussed above may operate to deposit refractory metal layers on the substrate employing ALD techniques. Depending on the specific stage of processing, the refractory metal layer may be deposited on the material from which the substrate 42 is fabricated, e.g., $SiO_2$. The refractory metal layer may also be deposited on a layer previously formed on the substrate 42, e.g., titanium, titanium nitride and the like.

ALD proceeds by chemisorption. The initial surface of the substrate 42 presents an active ligand to the process region. A batch of a first processing gas, in this case $Aa_x$, results in a layer of A being deposited on the substrate 42 having a surface of ligand x exposed to the processing chamber 37. Thereafter, a purge gas enters the processing chamber 37 to purge the gas $Aa_x$. After purging gas $Aa_x$ from the processing chamber 37, a second batch of processing gas, $Bb_y$, is introduced into the processing chamber 37. The a ligand present on the substrate surface reacts with the b ligand and B atom on the, releasing molecules ab and Ba, that move away from the substrate 42 and are subsequently pumped from the processing chamber 37. In this manner, a surface comprising a monolayer of A atoms remains upon the substrate 42 and exposed to the processing chamber 37, shown in FIG. 4. The process proceeds cycle after cycle, until the desired thickness is achieved.

Figure 5:
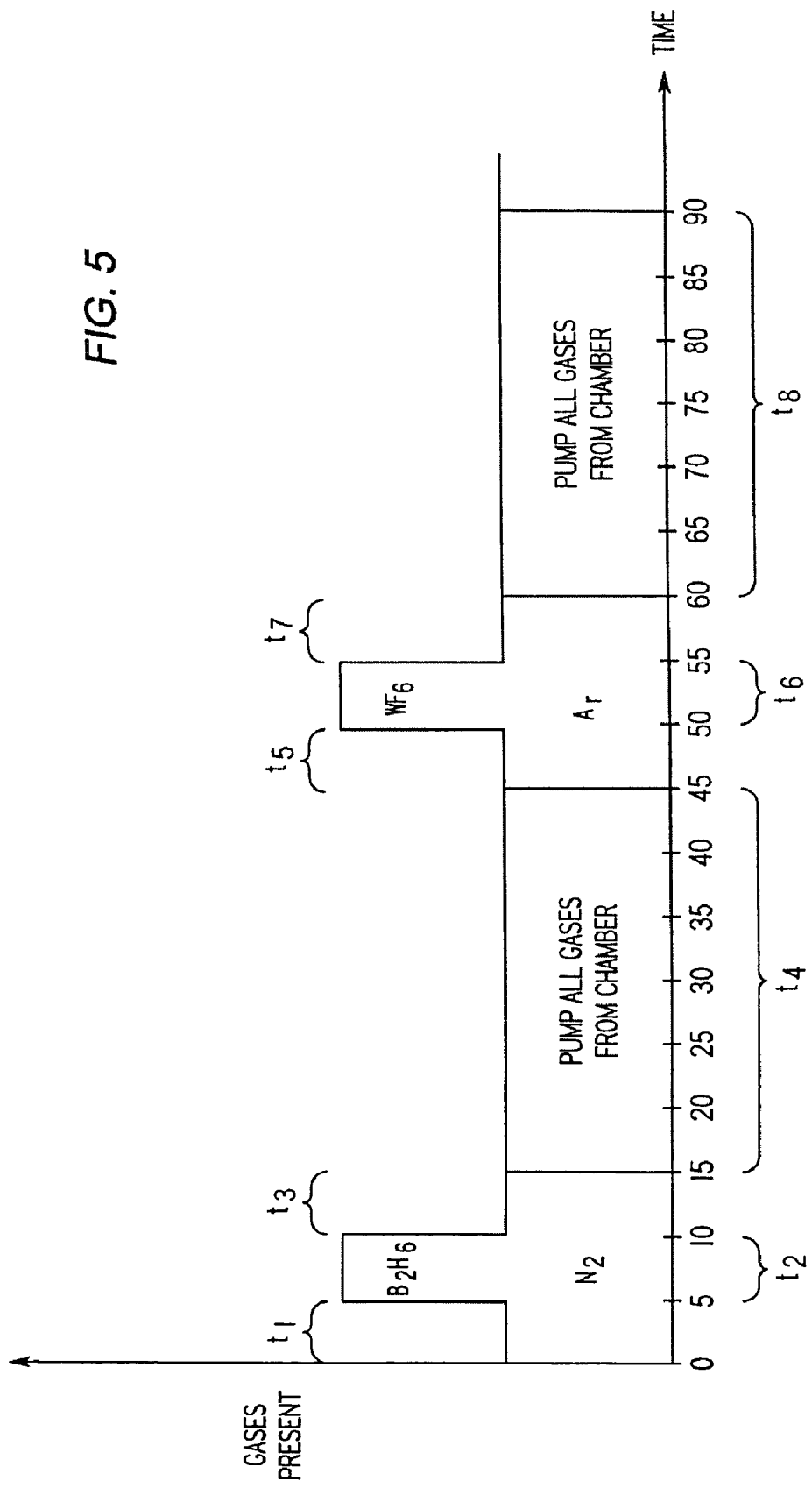
FIG. 5 is a graphical representation showing the concentration of gases introduced into the processing chamber shown above in FIG. 2, and the time in which the gases are present in the processing chamber, in accordance with the present invention.

Referring to both FIGS. 2 and 5, although any type of processing gas may be employed, in the present example, the processing gas $Aa_x$ is $WF_6$ and the processing gas $Bb_y$ is $B_2H_6$. Two purge gases were employed: Ar and $N_2$. Each of the processing gases is flowed into the processing chamber 37 with a carrier gas, which in this example were one of the purge gases: $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into the processing chamber 37 during time $t_1$, which is approximately five seconds before $B_2H_6$ is flowed into the processing chamber 37. During time $t_2$, the processing gas $B_2H_6$ is flowed into the processing chamber 37 for approximately five seconds, along with a carrier gas, which in this example is $N_2$. After five seconds have lapsed, the flow of $B_2H_6$ terminates and the flow of $N_2$ continues during time $t_3$ for an additional five seconds, purging the processing chamber of $B_2H_6$. During time $t_4$, the processing chamber 37 is pumped so as to remove all gases. The pumping process lasts approximately thirty seconds. After pumping of the process chamber 37, the carrier gas Ar is introduced for approximately five seconds during time $t_5$, after which time the process gas $WF_6$ is introduced into the processing chamber 37 for about five seconds, along with the carrier gas Ar during time $t_6$. The flow of the processing gas $WF_6$ into the processing chamber 37 is terminated approximately five seconds after it commenced. After the flow of $WF_6$ into the processing chamber 37 terminates, the flow of Ar continues for five additional seconds, during time $t_7$. Thereafter, the processing chamber 37 is pumped so as to remove all gases therein, during time $t_8$. As before, the pumping process lasts approximately thirty seconds, thereby concluding one cycle of the ALD technique in accordance with the present invention.

The benefits of employing ALD are manifold, including flux-independence of layer formation that provides uniformity of deposition independent of the size of a substrate. For example, the measured difference of the layer uniformity and thickness measured between of 200 mm substrate and a 32 mm substrate deposited in the same chamber is negligible. This is due to the self-limiting characteristics of chemisorption. Further, the chemisorption characteristics contribute to near-perfect step coverage over complex topography.

Figure 4:
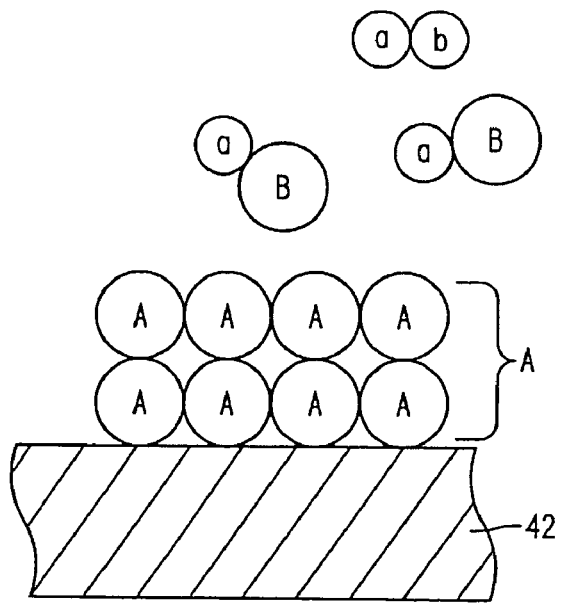
FIG. 4 is a schematic view showing deposition of second molecule onto a substrate during ALD to form a refractory metal layer.
Figure 6:
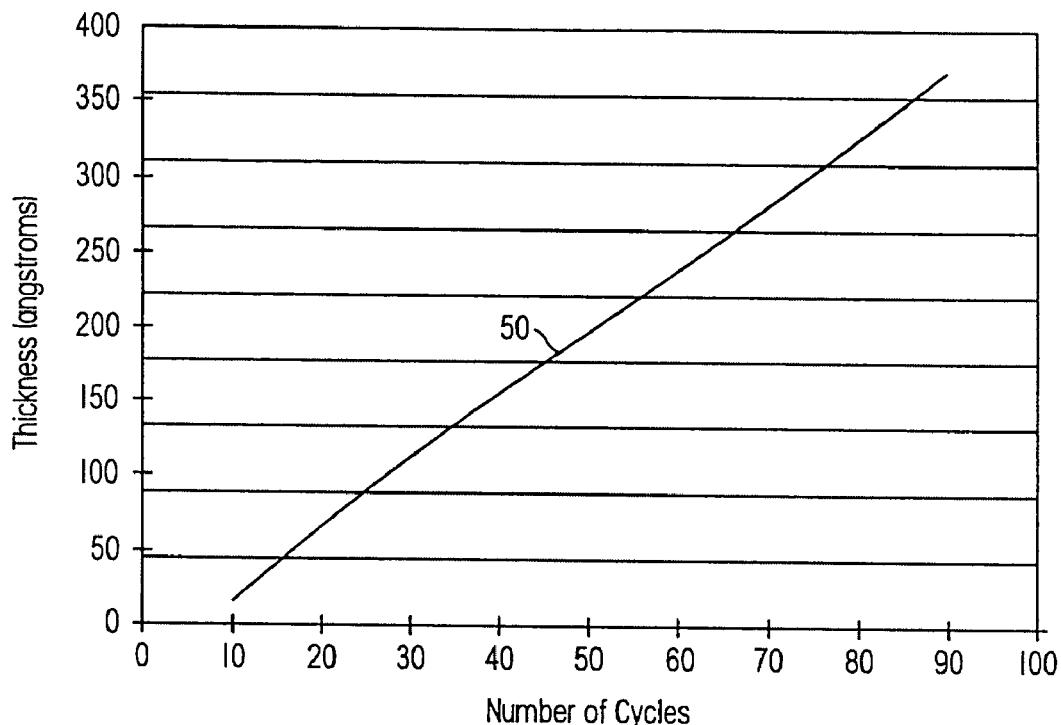
FIG. 6 is a graphical representation showing the relationship between the number of ALD cycles and the thickness of a layer formed on a substrate employing ALD, in accordance with the present invention.
Figure 7:
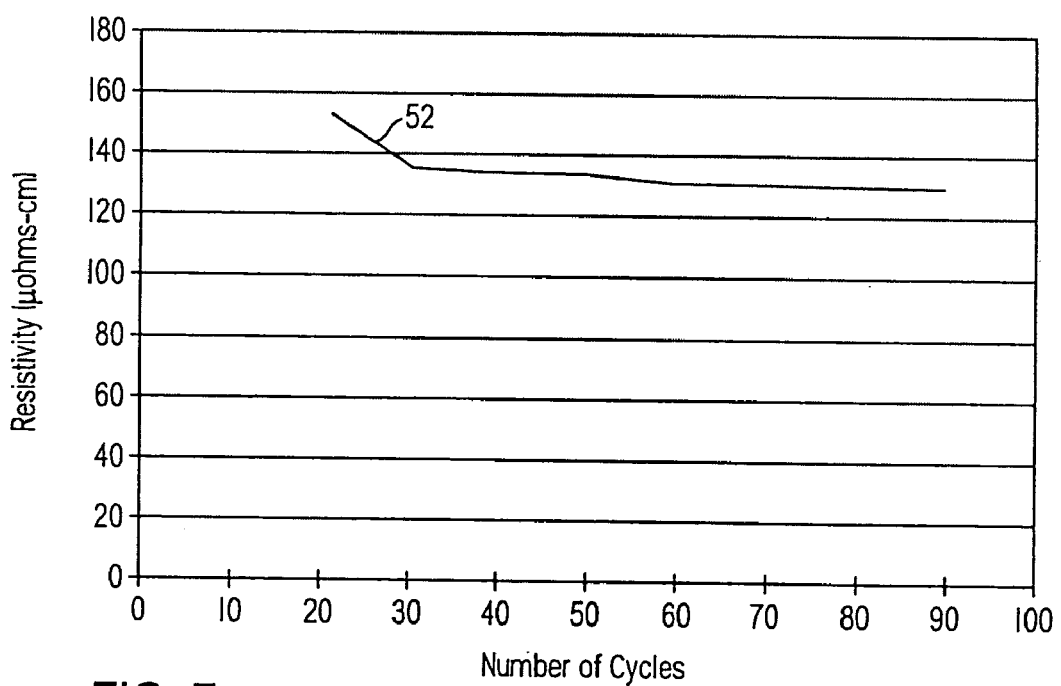
FIG. 7 is a graphical representation showing the relationship between the number of ALD cycles and the resistivity of a layer formed on a substrate employing ALD, in accordance with the present invention.

In addition, the thickness of the layer A, shown in FIG. 4, may be easily controlled while minimizing the resistance of the same by employing ALD. With reference to FIG. 6 it is seen by the slope of line 50 that the thickness of the tungsten layer A is proportional to the number of cycles employed to form the same. The resistivity of the tungsten layer, however, is relatively independent of the thickness of the layer, as shown by the slope of line 52 in FIG. 7. Thus, employing ALD, the thickness of a refractory metal layer may be easily controlled as a function of the cycling of the process gases introduced into the processing chamber with a negligible effect on the resistivity.

Figure 8:
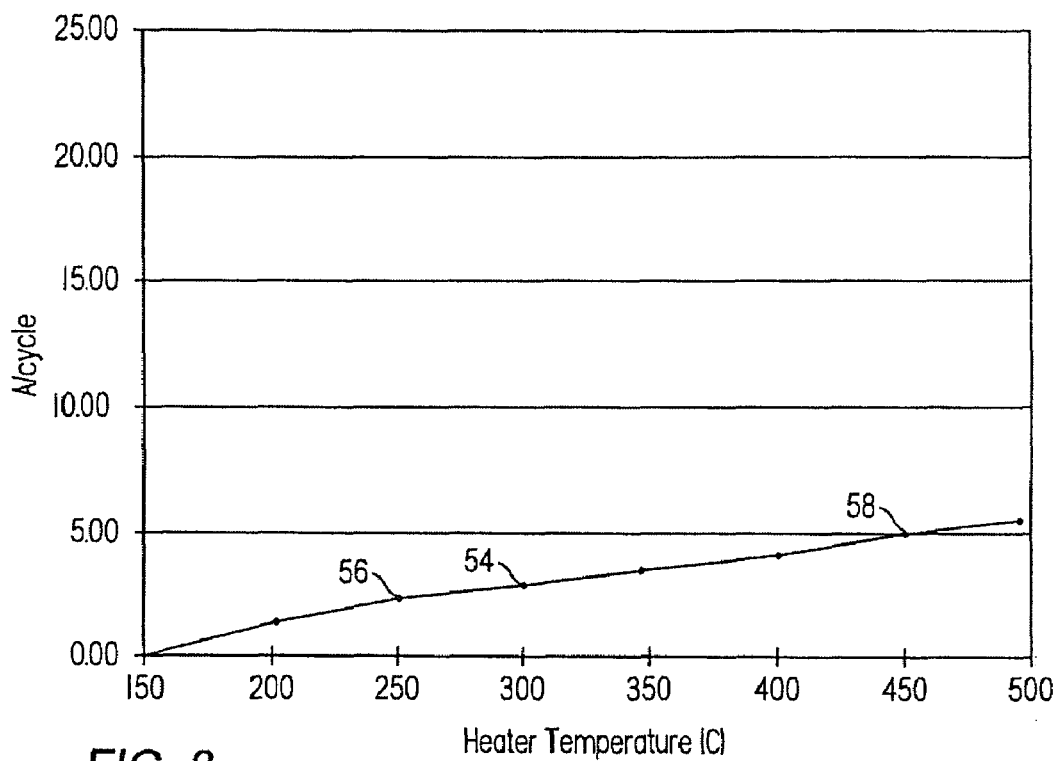
FIG. 8 is a graphical representation showing the relationship between the deposition rate of a layer formed on a substrate employing ALD and the temperature of the substrate.
Figure 9:
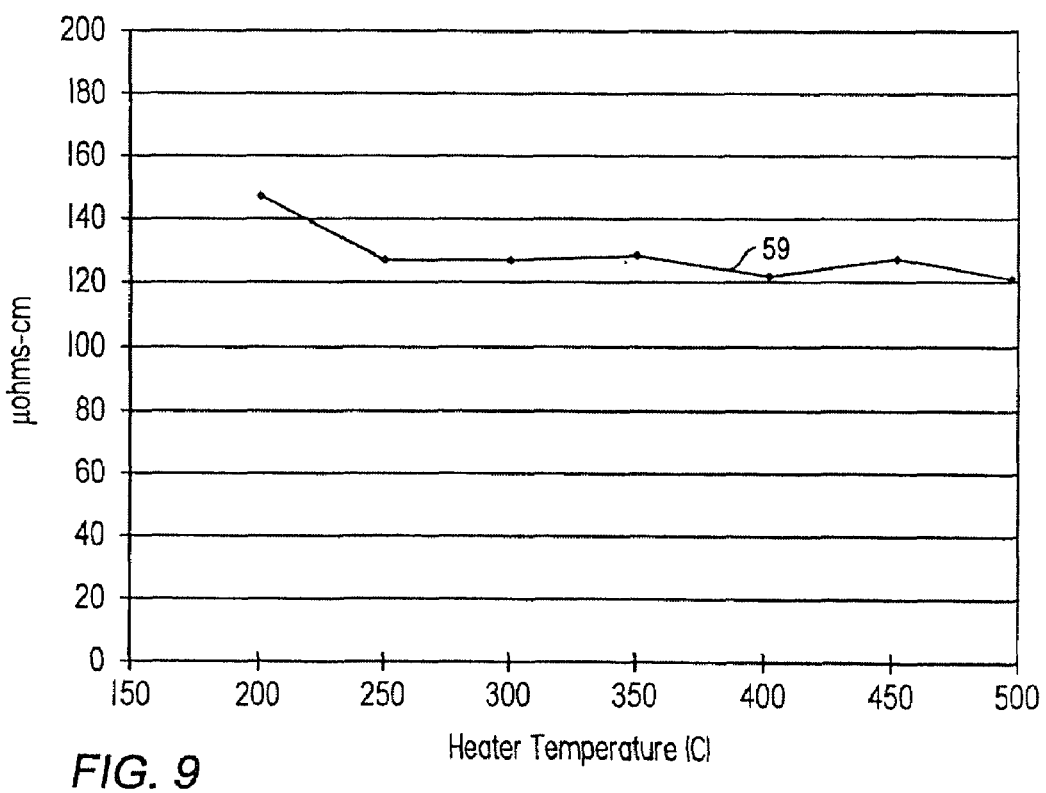
FIG. 9 is a graphical representation showing the relationship between the resistivity of a layer formed on a substrate employing ALD and the temperature of the substrate, in accordance with the present invention.

Referring to FIG. 8, control of the deposition rate was found to be dependent upon the temperature of the substrate 42. As shown by the slope of line 54, increasing the temperature of the substrate 42 increased the deposition rate of the tungsten layer A. For example, at 56, the deposition rate is shown to be approximately 2 Å/cycle at 250° C. However at point 58 the deposition rate is approximately 5 Å/cycle at a temperature of 450° C. The resistivity of the tungsten layer, however, is virtually independent of the layer thickness, as shown by the slope of curve 59, shown in FIG. 9. As a result, the deposition rate of the tungsten layer may be controlled as a function of temperature without compromising the resistivity of the same. However, it is preferred to perform many processing steps at temperatures well below 450° C.

Figure 10:
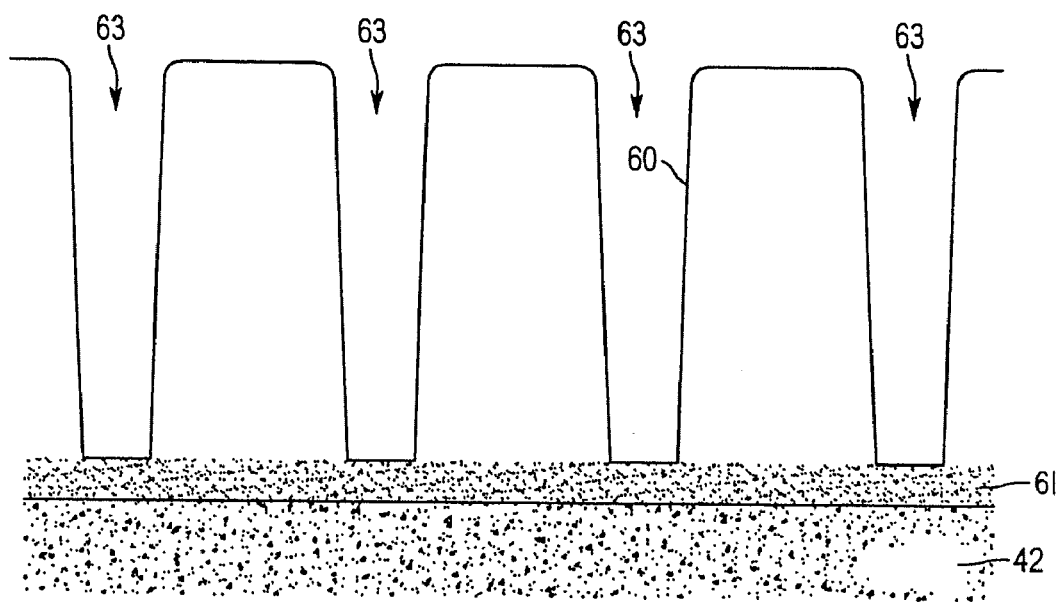
FIG. 10 is a cross-sectional view of a patterned substrate having a nucleation layer formed thereon employing ALD, in accordance with the present invention.
Figure 11:
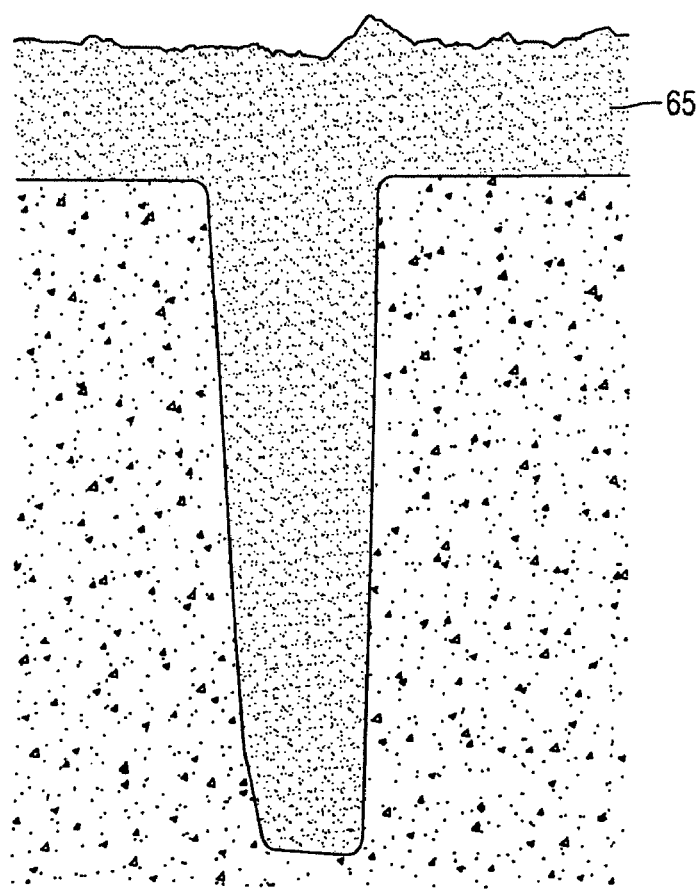
FIG. 11 is a partial cross-sectional view of the substrate, shown above in FIG. 10, with a refractory metal layer formed atop of the nucleation layer employing CVD, in accordance with the present invention.

To that end, a bifurcated deposition process may be practiced in which nucleation of the refractory metal layer occurs in a different chamber than the formation of the remaining portion of the refractory metal layer. Specifically, in the present example, nucleation of a tungsten layer occurs in chamber 12 employing the ALD techniques discussed above, with the substrate 42 being heated in the range of 200° C. to 400° C., and the processing chamber 37 being pressurized in the range of 1 to 10 Torr. A nucleation layer 60 of approximately 12 to 20 nm is formed on a patterned substrate 42, shown in FIG. 10. As shown, the substrate 42 includes a barrier layer 61 and a patterned layer having a plurality of vias 63. The nucleation layer is formed adjacent to the patterned layer covering the vias 63. As shown, forming the nucleation layer 60 employing ALD techniques provides 100% step coverage. To decrease the time required to form a complete layer of tungsten, a bulk deposition of tungsten onto the nucleation layer 60 occurs using CVD techniques, while the substrate 42 is disposed in processing chamber 14, shown in FIG. 1. The bulk deposition may be performed using recipes well known in the art. In this manner, a tungsten layer 65 providing a complete plug fill is achieved on the patterned layer with vias having aspect ratios of approximately 6:1, shown in FIG. 11.

Figure 12:
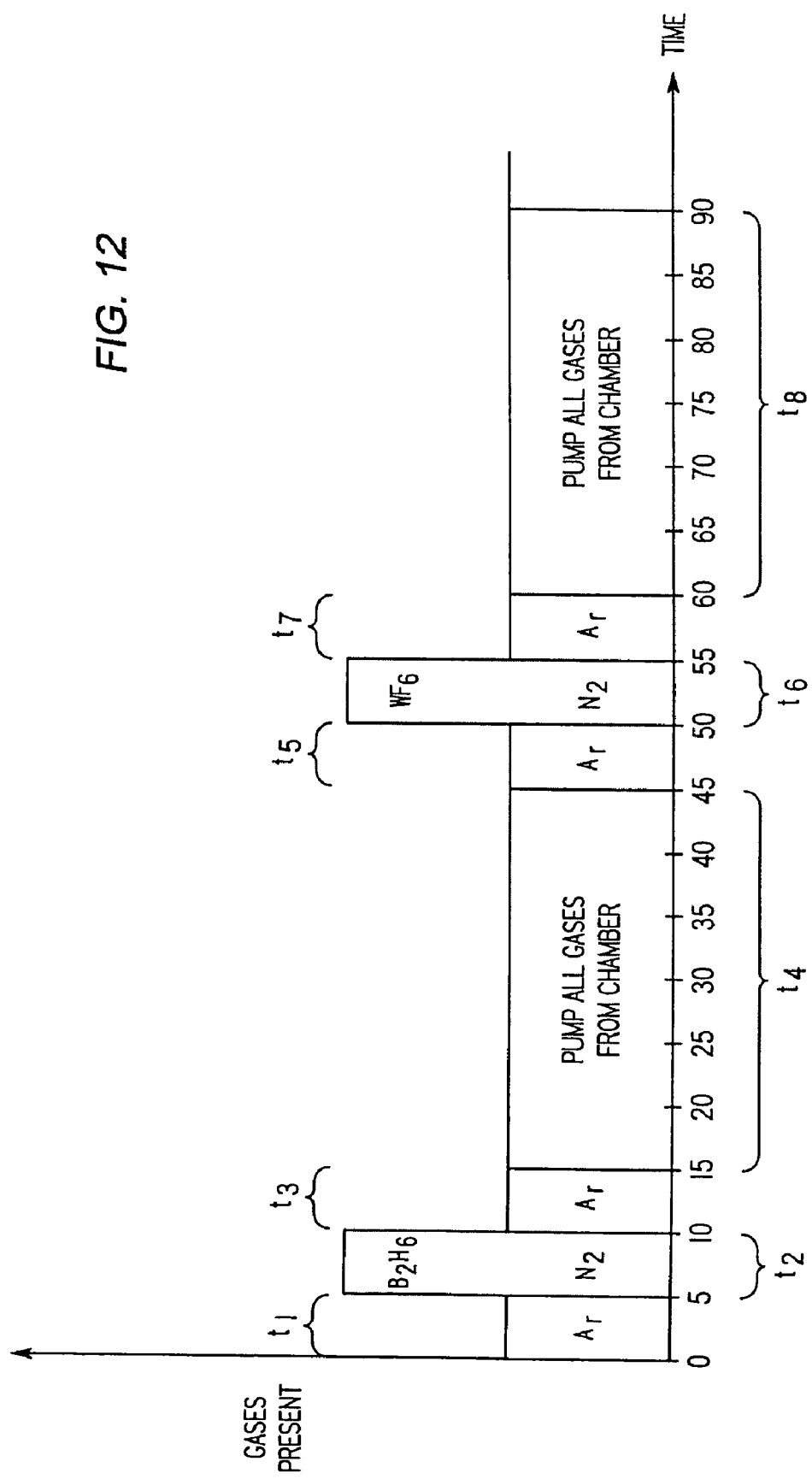
FIG. 12 is a graphical representation showing the concentration of gases shown above in FIG. 5 in accordance with a first alternate embodiment of the present invention.
Figure 13:
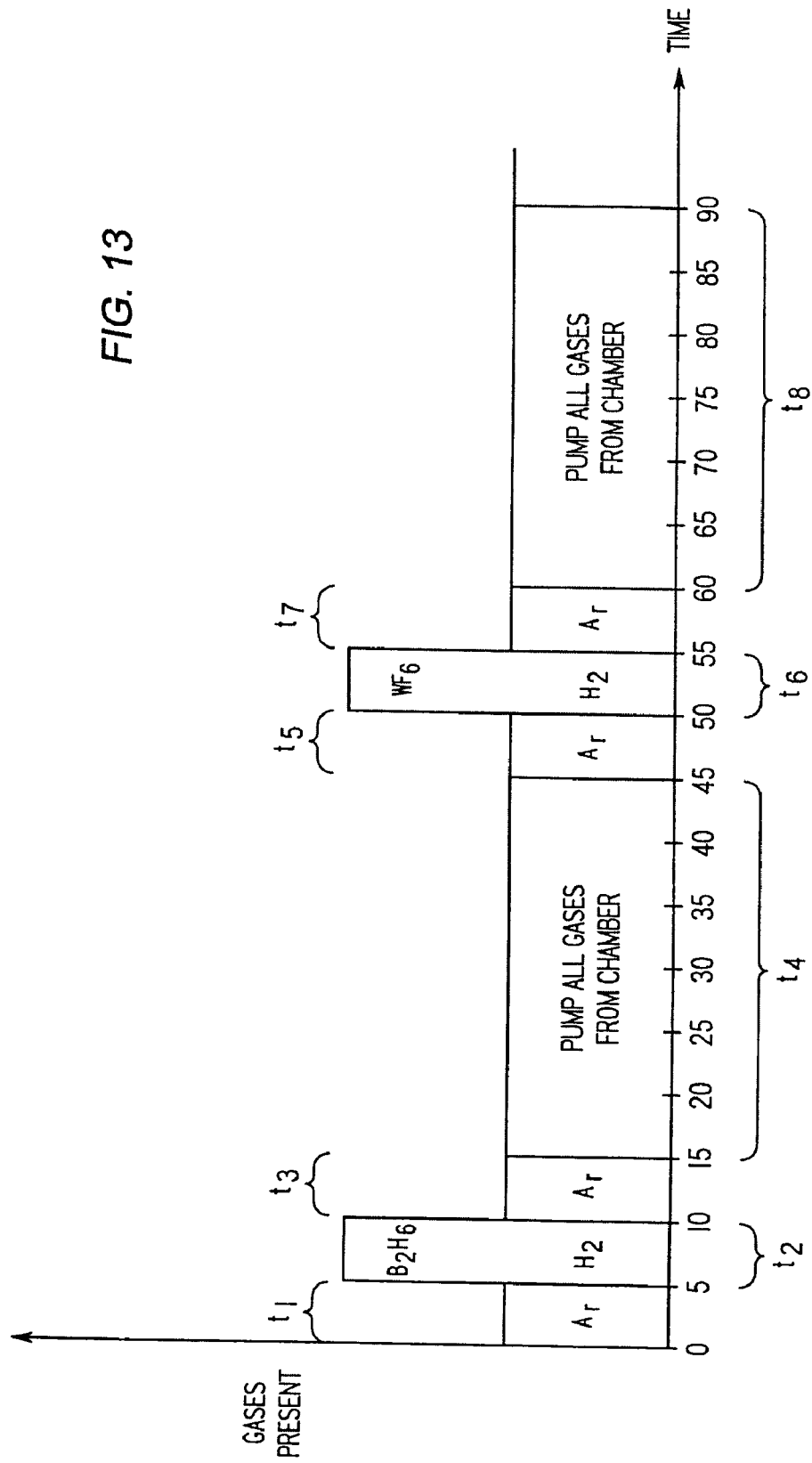
FIG. 13 is a graphical representation showing the concentration of gases shown above in FIG. 5 in accordance with a second alternate embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$ and $t_7$ comprises of Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $WF_6$ and $N_2$. The pump process during time intervals $t_4$ and $t_8$ is identical to the pump process discussed above with respect to FIG. 5. In yet another embodiment, shown in FIG. 13, the carrier gas during time intervals $t_2$ and $t_6$ comprises $H_2$, with the purge gas introduced at time intervals $t_1$, $t_3$, $t_5$ and $t_7$ comprising of Ar. The pump processes at time intervals $t_4$ and $t_8$ are as discussed above. As a result, at time interval $t_2$ the gas mixture introduced into the processing chamber 37 consists of $B_2H_6$ and $H_2$, and $WF_6$ and $H_2$, at time interval $t_6$.

Figure 14:
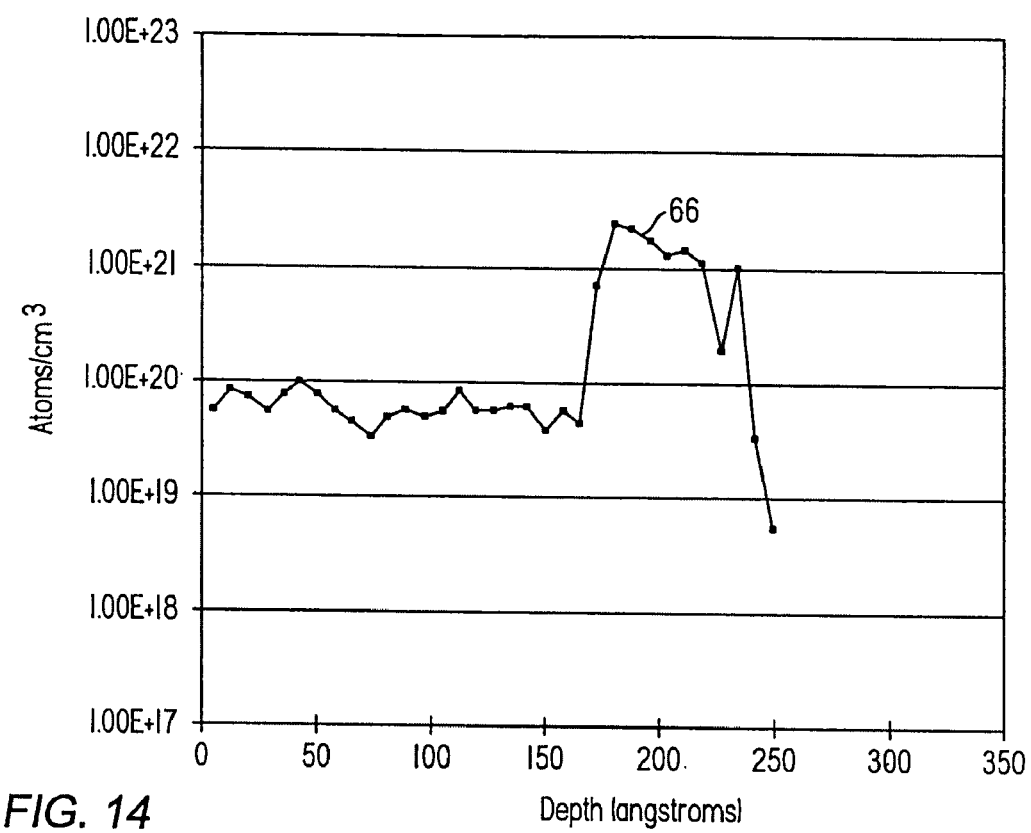
FIG. 14 is a graphical representation showing the fluorine content versus depth of a refractory metal layer formed on a substrate employing ALD either Ar or $N_2$ being a carrier gas.
Figure 15:
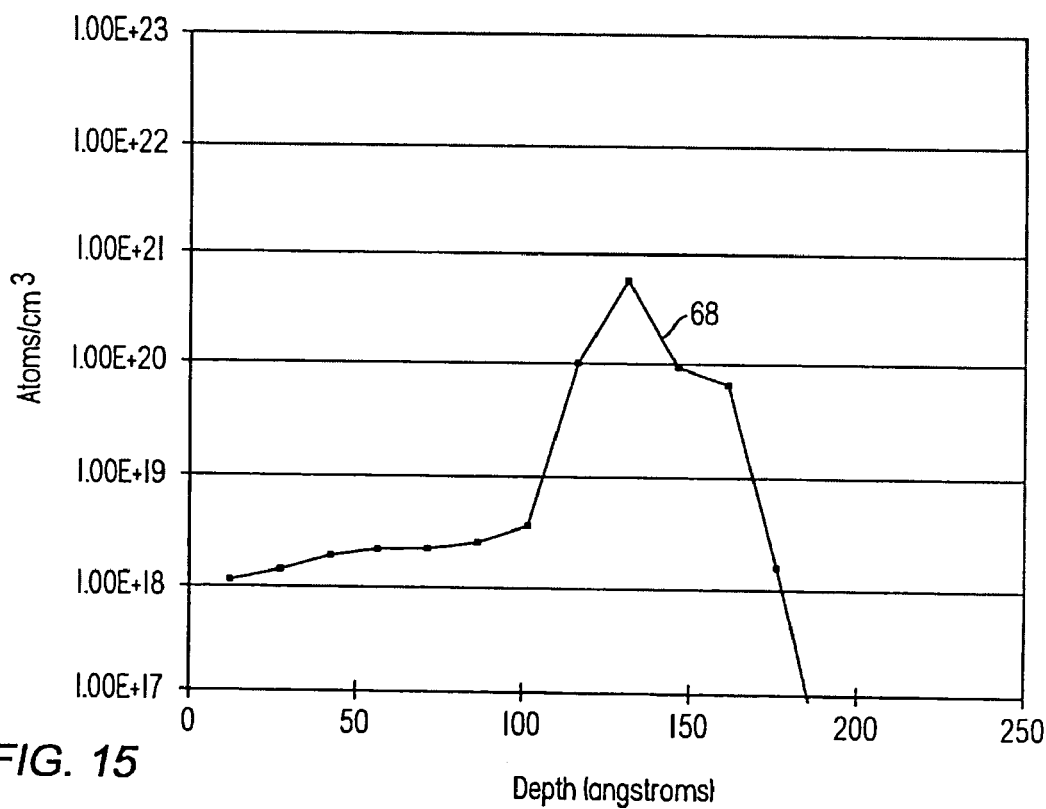
FIG. 15 is a graphical representation showing the fluorine content versus depth of a refractory metal layer formed on a substrate employing ALD with $H_2$ being a carrier gas.

An advantage realized by employing the $H_2$ carrier gas is that the stability of the tungsten layer A may be improved. Specifically, by comparing curve 66 in FIG. 14 with the curve 68 in FIG. 15, it is seen that the concentration of fluorine in the nucleation layer 60 is much less when $H_2$ is employed as the carrier gas, as compared with use of $N_2$ or Ar as a carrier gas. Specifically, the apex and nadir of curve 66 show that the fluorine concentration reaches levels in excess of $1\times10^{21}$ atoms per cubic centimeter and only as low as just below $1\times10^{19}$ atoms per cubic centimeter. Curve 68, however, shows that the fluorine concentration is well below $1\times10^{21}$ atoms per cubic centimeter at the apex and well below $1\times10^{17}$ atoms per cubic centimeter at the nadir. Thus, employing $H_2$ as the carrier gas provides a much more stable film, i.e., the probability of fluorine diffusing into the substrate, or adjacent layer is reduced. This also reduces the resistance of the refractory metal layer by avoiding the formation of a metal fluoride that may result from the increased fluorine concentration. Thus, the stability of the nucleation layer, as well as the resistivity of the same, may be controlled as a function of the carrier gas employed. This is also true when a refractory metal layer is deposited entirely employing ALD techniques, i.e., without using other deposition techniques, such as CVD.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, Fortran and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and, compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein. In addition, other refractory metals may be deposited, in addition to tungsten, and other deposition techniques may be employed in lieu of CVD. For example, physical vapor deposition (PVD) techniques, or a combination of both CVD and PVD techniques may be employed. Therefore, the scope of the invention should not be based upon the foregoing description. Rather, the scope of the invention should be determined based upon the claims recited herein, including the full scope of equivalents thereof.

What is claimed is:

1. A method for forming a layer on a substrate disposed in a processing chamber, said method comprising:
    chemisorbing onto said substrate alternating monolayers of a first compound and a second compound, with said second compound having fluorine atoms associated therewith, with each of said first and second compounds being introduced into said processing chamber along with a carrier gas;
    purging said processing chamber following chemisorption of each of the alternating monolayers, wherein the purging said processing chamber includes flowing a purge gas therein; and
    controlling a quantity of said fluorine atoms associated with the monolayer of said second compound as a function of said carrier gas, wherein the purge gas has differing constituents from the carrier gas for each of said first and second compounds.

2. The method of claim 1, wherein controlling said quantity of said fluorine atoms includes selecting said carrier gas from a group of gases consisting of nitrogen ($N_2$), argon (Ar), and hydrogen ($H_2$).

3. The method of claim 1, wherein said first compound includes a boron-containing compound.

4. The method of claim 1, wherein said second compound includes a refractory metal selected from the group consisting of titanium (Ti) and tungsten (W).

5. The method of claim 1, wherein purging of said processing chamber includes pumping said processing chamber clear of all gases disposed therein after flowing the purge gas therein.

6. The method of claim 1, wherein chemisorbing onto said substrate alternating monolayers of a first compound and a second compound comprises serially exposing said substrate to the first and second compound.

7. The method of claim 1, wherein said first compound includes diborane ($B_2H_6$) and said second compound is $WF_6$.

8. The method of claim 1, wherein the purge gas is argon, and the carrier gas is selected from the group consisting of nitrogen and hydrogen.

9. The method of claim 1, wherein the purge gas is argon.

10. A method for forming a layer on a substrate in a processing chamber, comprising:
    exposing the substrate to a first compound and a second compound, the second compound comprising fluorine, and chemisorbing onto the substrate alternating monolayers of the first compound and the second compound, with the first and second compounds being introduced into the processing chamber along with one or more carrier gases; and
    purging the processing chamber following chemisorption of each of the alternating monolayers, wherein the purging the processing chamber comprises flowing a purge gas in the processing chamber, and wherein the purge gas and at least one of the one or more carrier gases have differing constituents.

11. The method of claim 10, wherein the second compound is $WF_6$.

12. The method of claim 10, wherein the chemisorbing onto the substrate alternating monolayers of the first compound and the second compound forms a refractory metal layer on the substrate.

13. The method of claim 12, wherein the refractory metal layer is a tungsten layer.

14. The method of claim 12, wherein the refractory metal layer is a nucleation layer.

15. The method of claim 10, wherein the purge gas is argon and at least one of the one or more carrier gases is selected from the group consisting of nitrogen and hydrogen.

16. A method for forming a layer on a substrate disposed in a processing chamber, said method comprising:
    chemisorbing onto said substrate alternating monolayers of a first compound and a second compound, with the second compound having fluorine atoms associated therewith, with each of the first and second compounds being introduced into the processing chamber along with a carrier gas, wherein the first and second compounds are introduced with the same carrier gas, and the carrier gas is argon; and purging the processing chamber, wherein the purging the processing chamber includes flowing a purge gas therein, and wherein the purge gas and the carrier gas have differing constituents.

17. The method of claim 16, wherein the first compound includes diborane and the second compound is $WF_6$.

18. The method of claim 16, wherein the chemisorbing onto the substrate alternating monolayers of the first compound and the second compound forms a refractory metal layer on the substrate.

19. The method of claim 18, wherein the refractory metal layer is a tungsten layer.

20. The method of claim 18, wherein the refractory metal layer is a nucleation layer.

21. A method for forming a layer on a substrate in a processing chamber, comprising:
    serially exposing the substrate to a first compound and a second compound, wherein one of the first compound and the second compound comprises fluorine, and the first compound and the second compound are introduced into the processing chamber with one or more carrier gases;
    depositing a monolayer on the substrate from the first compound, wherein the second compound reacts with the first compound on the substrate; and
    repeating the serially exposing the substrate to depositing multiple monolayers; and
    purging the process chamber following deposition of each monolayer, wherein the purging the processing chamber comprises flowing a purge gas in the processing chamber, and wherein the purge gas and at least one of the one or more carrier gases have differing constituents.

22. The method of claim 21, wherein the first compound is $WF_6$.

23. The method of claim 22, wherein the second compound is diborane.

24. The method of claim 21, wherein the one or more carrier gases comprises nitrogen or hydrogen.

25. The method of claim 21, wherein the multiple monolayers form a refractory metal layer.

26. The method of claim 25, wherein the refractory metal layer is a tungsten layer.

* * * * *